United States Patent
Allende

(10) Patent No.: US 9,231,569 B2
(45) Date of Patent: Jan. 5, 2016

(54) VARIABLE DELAY AND SETUP TIME FLIP-FLOP

(71) Applicant: Alexandro Giron Allende, Zapopan (MX)

(72) Inventor: Alexandro Giron Allende, Zapopan (MX)

(73) Assignee: Freescale Semiconductor, Inc., Austin, TX (US)

( * ) Notice: Subject to any disclaimer, the term of this patent is extended or adjusted under 35 U.S.C. 154(b) by 17 days.

(21) Appl. No.: 13/749,542

(22) Filed: Jan. 24, 2013

(65) Prior Publication Data

US 2014/0203857 A1 Jul. 24, 2014

(51) Int. Cl.
*H03K 3/00* (2006.01)
*H03K 3/037* (2006.01)

(52) U.S. Cl.
CPC .................................. *H03K 3/0375* (2013.01)

(58) Field of Classification Search
CPC ....... H03L 7/0995; H03L 7/07; H03L 7/0812; H03L 7/0805; H03L 7/091
See application file for complete search history.

(56) References Cited

U.S. PATENT DOCUMENTS

| | | | | |
|---|---|---|---|---|
| 5,963,606 A * | 10/1999 | Drost et al. | | 375/371 |
| 6,850,124 B1 * | 2/2005 | Li | | 331/57 |
| 7,515,656 B2 * | 4/2009 | Yamaguchi et al. | | 375/326 |
| 7,557,606 B1 | 7/2009 | Chen et al. | | |
| 7,944,237 B2 | 5/2011 | Habel et al. | | |
| 8,222,921 B2 | 7/2012 | Lewis et al. | | |
| 8,565,362 B2 * | 10/2013 | Kim | | 375/371 |
| 2007/0063752 A1 | 3/2007 | Kowalczyk et al. | | |
| 2010/0264972 A1 | 10/2010 | Chi et al. | | |
| 2012/0218016 A1 * | 8/2012 | Nomura | | 327/161 |

* cited by examiner

*Primary Examiner* — Sibin Chen
(74) *Attorney, Agent, or Firm* — Quarles & Brady LLP

(57) ABSTRACT

An apparatus is provided. The apparatus includes a flip-flop including an input configured to receive a setup time and delay control (SDC) signal, and an output buffer including first and second conductive paths. The second conductive path is non-conductive when the SDC signal has a first value at the input and is conductive when the SDC signal has a second value at the input. The apparatus includes a propagation delay sensor configured to estimate a propagation delay of the flip-flop, and, when the estimated propagation delay exceeds a threshold, supply the SDC signal having the second value to the input of the flip-flop.

9 Claims, 5 Drawing Sheets

VARIABLE DELAY AND SETUP TIME FLIP-FLOP

FIELD OF THE INVENTION

Embodiments of the inventive subject matter relate to programmable sequential logic and, specifically, flip-flops having programmable or adjustable setup and propagation delay.

BACKGROUND OF THE INVENTION

To operate correctly, not only must the components of a semiconductor integrated circuit (IC) device be correctly designed, but the components must be capable of meeting the timing requirements of the circuit. Because ICs often operate at relatively high frequencies, if any of the individual components of the circuit exhibit excessive delay the device may fail to operate correctly. Accordingly, delays introduced by the individual components of the integrated circuit limit the maximum frequency of operation of the circuit.

In a device that includes a circuit having flip-flops and combinational logic, for example, the maximum speed of the device's system clock is limited by the setup and propagation delays of the flip-flops and the propagation delays of the combination logic incorporated into the device. To illustrate, FIG. 1 is a block diagram of a typical delay path in an integrated circuit. The delay path includes flip-flop 10 connected to flip-flop 12 through combination logic 14. In flip-flops 10 and 12, D represents a data input terminal, and Q represents a data output terminal. The terminal designated CK receives a clock signal that controls the operation of flip-flops 10 and 12.

As the clock signal cycles between states, flip-flop 10 releases data received on terminal D to combinational logic 14. This process introduces a first delay referred to as a flip-flop propagation delay (tp). After the data has been outputted by flip-flop 10 to combination logic 14, the data is processed by combinational logic 14, resulting in a combinational logic delay (tpcomb). Finally, combinational logic 14 supplies an output to flip-flop 12, which is set to a state based upon the value outputted by combinational logic 14. In order to capture the data from the combinational logic 14 correctly within flip flop 12, the data signal has to be established before the next clock positive edge. This required time margin is the set up time of the flip flop 12 (ts). Therefore, the total delay of the delay path shown in FIG. 1 is equal to the sum of the flip-flop propagation delay (tp), combinational logic delay (tpcomb), and the flip-flop setup time (ts). This delay, then, becomes a limiting attribute of the circuit as the frequency of the clock cycle of the circuit is constrained by the delay.

A number of factors can affect the delay of the components of an integrated circuit. During fabrication of the circuit, processing conditions can affect the performance of individual components of an integrated circuit. These processing conditions are difficult to control and can make it difficult to predict how delays will be manifested within the circuit during normal operations. Additionally, the operating voltage of the circuit, as well as the temperature of the circuit can affect delay within the circuit. This combination of factors can be referred to as the process, voltage, and temperature (PVT) factors.

Because is it difficult to predict or control the delays that may occur within an integrated circuit due to the PVT factors, designers are generally forced to design circuits to operate in worst-case scenarios (e.g., where the fabrication process, operating voltage, and ambient temperature result in significant delays occurring within the circuit). Designing for such a worst-case scenario may result in the device consuming too much power, or operating at an unnecessarily-high frequency. Either scenario is undesirable as it results in a circuit that is not performing optimally.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

DETAILED DESCRIPTION

Figure 1:
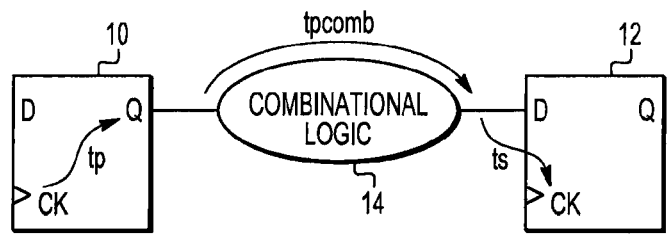
FIG. 1 is a block diagram of a typical delay path in an integrated circuit.

In overview, the present disclosure describes embodiments of methods and systems for adjustable sequential logic and more specifically techniques and apparatus for flip-flops having programmable or adjustable setup-time and delay.

In one embodiment, the present disclosure provides an apparatus. The apparatus includes a flip-flop including an input configured to receive a setup time and delay control (SDC) signal, and an output buffer including first and second conductive paths. The second conductive path is non-conductive when the SDC signal has a first value at the input and is conductive when the SDC signal has a second value at the input. The apparatus includes a propagation delay sensor configured to estimate a propagation delay of the flip-flop, and, when the estimated propagation delay exceeds a threshold, supply the SDC signal having the second value to the input of the flip-flop.

In another embodiment, the present disclosure provides a flip-flop including an input configured to receive a setup time and delay control (SDC) signal, and an output buffer including first and second conductive paths. The second conductive path is non-conductive when the SDC signal has a first value at the input and is conductive when the SDC signal has a second value at the input.

In another embodiment, the present disclosure provides a flip-flop including a first input configured to receive a first setup time and delay control (SDC) signal, a second input configured to receive a second SDC signal, and an output buffer including first, second, and third conductive paths. The second conductive path is non-conductive when the first SDC signal has a first value at the first input and is conductive when the first SDC signal has a second value at the first input. The third conductive path is non-conductive when the second SDC signal has a third value at the second input and is conductive when the second SDC signal has a fourth value at the second input.

The instant disclosure is provided to further explain in an enabling fashion the best modes, at the time of the application, of making and using various embodiments in accordance with the present disclosure. The disclosure is further offered to enhance an understanding and appreciation for the inventive principles and advantages thereof, rather than to limit in any manner the scope of the disclosure.

It is further understood that the use of relational terms, if any, such as first and second, top and bottom, and the like are used solely to distinguish one entity or action from another without necessarily requiring or implying any actual such relationship or order between such entities or actions.

Much of the functionality and many of the inventive principles are best implemented with or in integrated circuits (ICs) including possibly application specific ICs or ICs with integrated processing or control or other structures. It is expected that one of ordinary skill, when guided by the concepts and principles disclosed herein, will be readily capable of generating such ICs and structures with minimal experimentation. Therefore, in the interest of brevity and minimization of any risk of obscuring the principles and concepts according to below-described embodiments of the present disclosure, further discussion of such structures and ICs, if any, will be limited to the essentials with respect to the principles and concepts of the various embodiments.

The instant disclosure provides a flip-flop design having a delay and setup time control input. The input receives a setup and delay control (SDC) signal that selectively enables portions of the flip-flop to effect a reduction in the setup time and propagation delay of the flip-flop. Because the improved performance of the flip-flop results in increased power consumption, this optional input allows the power consumption of the flip-flops to be reduced when circumstances dictate that high performance is not required. Conversely, when normal flip-flop performance results in delays exceeding a particular threshold, the SDC signal can be employed to reduce the setup time and propagation delay of the flip-flop and, thereby, improve the performance of an integrated circuit including the flip-flop.

The present system uses a propagation delay sensor, such as a process, voltage, temperature (PVT) detector, to sense a change in conditions resulting in variance in propagation delay within the CMOS logic cells of an integrated circuit. When the sensed conditions indicate that the delays within the logic cells of the circuit have exceeded a particular threshold, the PVT detector outputs a corresponding signal. That signal is then passed to one or more of the flip-flops within the integrated circuit as an SDC signal. The SDC signal causes the flip-flop to operate with reduced delays (but consuming additional power). In this manner, as PVT conditions change, resulting in worsening performance of the logic cells of the integrated circuit, the SDC signal can be utilized to compensate for that worsening performance by reducing delays within the flip-flops of the integrated circuit. Conversely, as PVT conditions improve, the SDC signal can be modified to cause the logic cells to operate normally, thereby reducing the amount of power consumed by the circuit.

Figure 2:
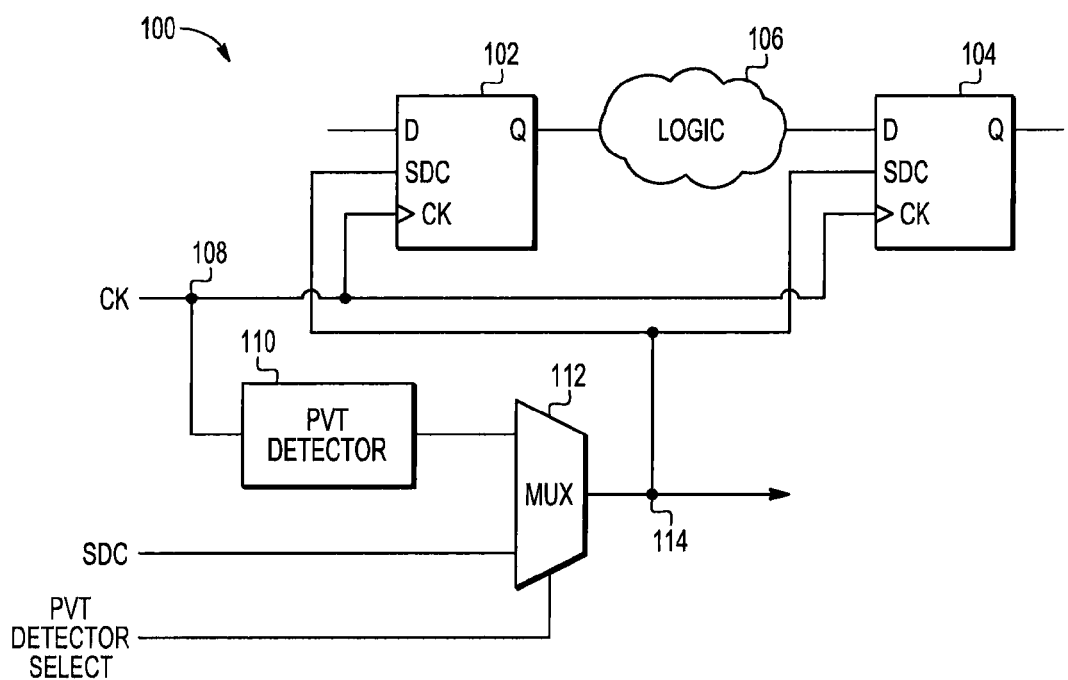
FIG. 2 is a block diagram of an example integrated circuit having a number of logical elements with a controllable delay.

FIG. 2 is a block diagram of an example integrated circuit having a number of logical elements with a controllable delay. Circuit 100 includes flip-flops 102 and 104 that are coupled to one another through combinational logic 106. Each of flip-flops 102 and 104 have input terminals for receiving an input data value (terminal D), an SDC signal (terminal SDC), and a clock signal (terminal CK). The clock signal is received from a source external to the circuit depicted in FIG. 2 via node 108. The delay and set-up time of each of flip-flops 102 and 104 is controlled by an SDC signal that is supplied to the SDC terminals of flip-flops 102 and 104.

Circuit 100 includes PVT detector 110 configured to monitor the operational status of circuit 100 and determine whether the propagation delays of the circuit have exceeded a particular threshold. If the threshold has been exceeded (or is estimated to have been exceeded), the output of PVT detector 110 is a high value. If not, the output of PVT detector 110 is a low value (though the high and low nature of the PVT detector output could be inverted, depending upon the circuit implementation).

A number of different configurations of PVT detector 110 may be utilized in circuit 100. In one example configuration, PVT detector 110 includes a flip-flop having a similar configuration and construction to those that will be controlled by the output of PVT detector 110 (e.g., flip-flops 102 and 104). By using a flip-flop having the same configuration, the actual performance of the flip-flops of the circuit can be monitored within PVT detector 110 by exposing the flip-flop in the PVT detector to the same conditions as the operational flip-flops in the integrated circuit.

Figure 3:
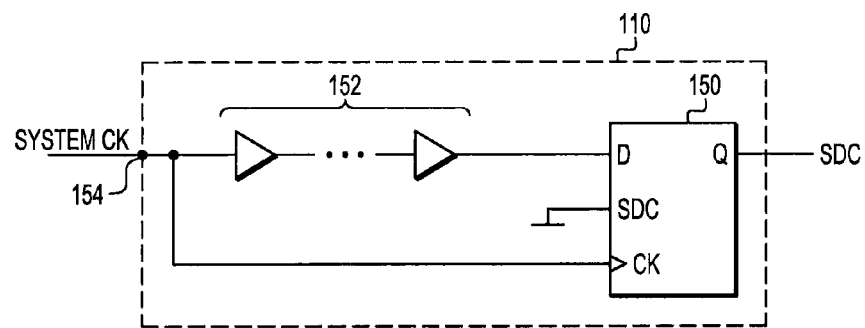
FIG. 3 is a block diagram showing an example implementation of a process, voltage, and temperature (PVT) detector.

FIG. 3 is a block diagram showing an example implementation of PVT detector 110. PVT detector 110 includes flip-flop 150. Flip-flop 150 has a similar configuration to that of flip-flops 102 and 104 of FIG. 2. In one implementation, the similar configuration means that flip-flop 150 was constructed using the same fabrication process and exposed to the same environmental conditions as that of flip-flops 102 and 104. Consequently, delays observed in the operation of flip-flop 150 will be somewhat similar to the delays observed in flip-flops 102 and 104.

The SDC terminal of flip-flop 150 is tied to ground causing flip-flop 150 to operate in its normal mode of operation. The data terminal D of flip-flop 150 is connected to a series of buffers 152. The number of buffers 152 in PVT detector 110 is selected based upon a desired threshold of PVT detector 110. Buffers 152 operate to delay the transmission of the system clock signal from terminal 154 to the data terminal D of flip-flop 150 and determine the threshold delay at which the output of PVT detector 110 goes high. The configuration of buffers 152 generally depends upon the operational requirements of PVT detector 110, as the size and technology used to implement buffers 152 will affect the length of delay. In one implementation, the number of buffers 152 is determined, at least in part, by a CKDelay value, which represents propagation delay of the buffer chain 152. For example, candidate configurations of buffers 152 may be determined using either of the following expressions:

Number of buffers=($CK$Delay on high delay detection)/(Single buffer propagation delay on high delay condition)

Number of buffers=($CK$Delay on low delay)/(Single buffer propagation delay on low delay)

Terminal 154 is also connected directly to the clock terminal of the flip-flop. The output of flip-flop 150 (Q) and PVT detector 110 itself goes high when a high-delay condition is detected.

In one implementation, PVT detector 110 is configured to output a first logic value (e.g., a logic high) output at the SDC signal when the following condition is met:

$T\text{period}*n/2+T\text{hold}<CK\text{Delay}<T\text{period}*n-T\text{setup}$ where Tperiod is the system clock period, Thold is the PVT flip-flop 150 hold time, Tsetup is the PVT flip-flop 150 setup time, and n is a number of system clock periods. In some implementations, a 10% margin is provided in the threshold.

In such an implementation, PVT detector 110 is configured to output a second logic value (e.g., a logic low) at the SDC signal when the following condition is met:

$$Thold < CKDelay < Tperiod*n + Thold$$

The SDC signal generated by PVT detector 110 can be supplied to one or more flip-flops that are members of the same clock domain within an integrated circuit.

Figure 4:
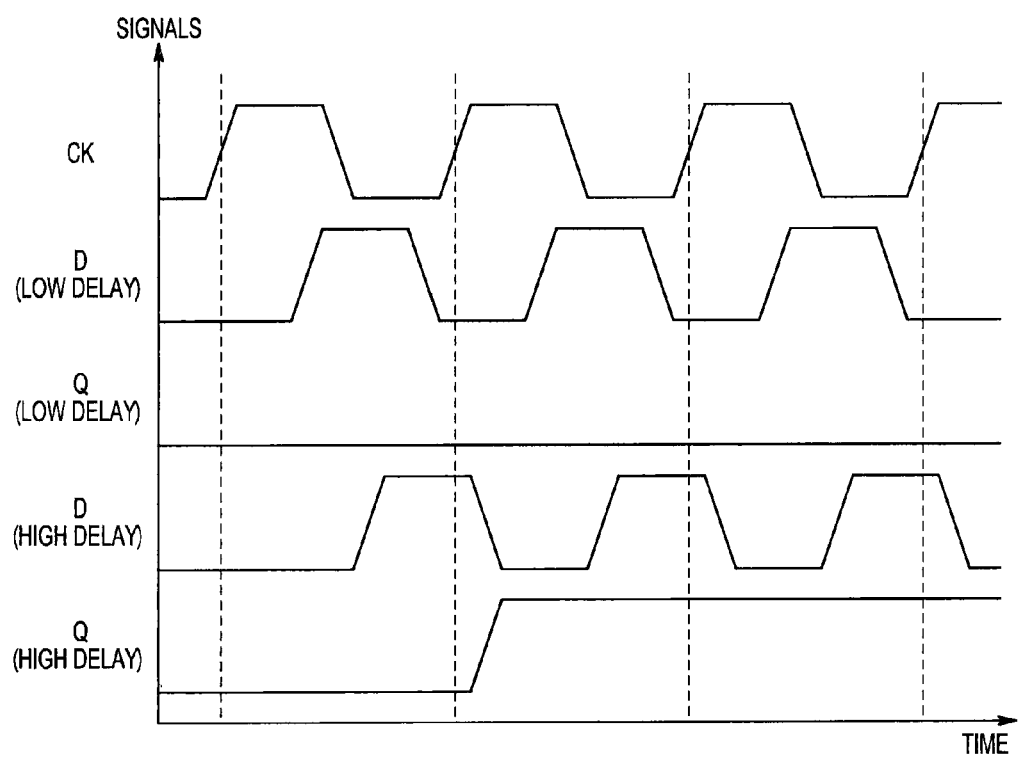
FIG. 4 shows an example of a series of waveforms demonstrating the various states of a PVT detector.

FIG. 4 shows an example of a series of waveforms demonstrating the various states of PVT detector 110. The top waveform depicts the system clock alternating between its low and high values. The second waveform show a low delay signal being supplied to the D input terminal of flip-flop 150. With the low delay signal, the output of flip-flop 150 (and PVT detector 110) stays low (as indicated by the third waveform Q (low delay)).

The fourth waveform shows a high delay signal being supplied to the D input terminal of flip-flop 150. With the high delay signal, the output of flip-flop 150 (and PVT detector 110) goes high (as indicated by the fifth waveform Q (high delay)). The high signal can then be supplied to one or more flip-flop in the integrated circuit (see flip-flops 102 and 104 of FIG. 2) causing them to begin operating in a low-delay mode.

Returning to FIG. 2, in some implementations, the output of PVT detector 110 is supplied directly to the SDC terminals of one or more flip-flops. In the example of FIG. 2, though, the output of PVT detector 110 is instead supplied as an input to multiplexer (mux) 112. A select line of mux 112 receives a PVT detector select signal. When the select line has a first value, output from PVT detector 110 is passed to the SDC terminals of connected flip-flops. However, when the select line has a second value, mux 112 instead outputs the value of the setup/delay control signal. The setup/delay control signal input to mux 112 can be used to manually control the SDC signal being outputted by mux 112, thereby overriding the operation of PVT detector 110.

Figure 5:
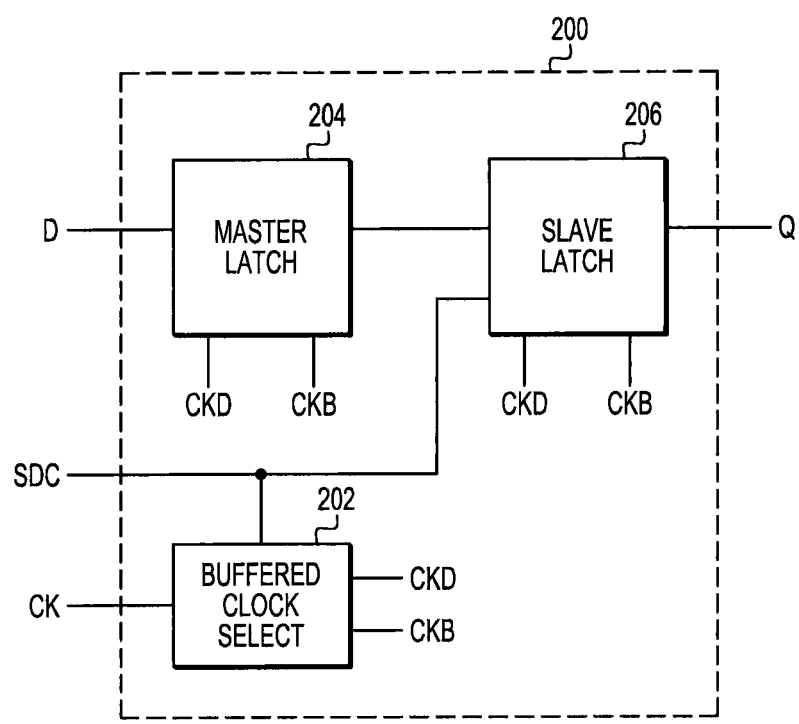
FIG. 5 is a block diagram showing an embodiment of a flip-flop having an SDC control terminal for selecting a programmable delay and set-up time of the flip-flop.

FIG. 5 is a block diagram showing an embodiment of a flip-flop 200 having an SDC control terminal for selecting a programmable delay of the flip-flop. Flip-flop 200 includes a data input terminal D, an SDC input terminal SDC, and a clock input terminal CK. The clock input is connected to a buffered clock select block 202, which generates two output signals; a delayed clock signal CKD and an inverted clock signal CKB. The data input terminal is connected to a first latch 204 which is, in turn, connected to a second latch 206. The output of latch 206 becomes the output of flip-flop 200 at terminal Q. The operation of both latches 204 and 206 are controlled by the input data signal, as wells as the clock signals CKD and CKB.

The SDC input terminal of flip-flop 200 receives an SDC signal (for example, generated by the output of a PVT detector, such as PVT detector 110 of FIG. 2). When the SDC signal is present, the operation of an output buffer operating in conjunction with the latch is modified to reduce the operation time thereof. Similarly the buffered clock select block 202 includes a terminal configured to receive the SDC signal. When the SDC signal is present, the outputs of buffered clock select block 202 are modified to increase the delay associated with the clock's delayed clock signal CKD to compensate for delays in the transmission gates of the flip-flop. By generating a delayed clock signal, more time is allowed for the data signal D to pass through the transmission gates and, as a result, the device's setup time is also increased.

Figure 6:
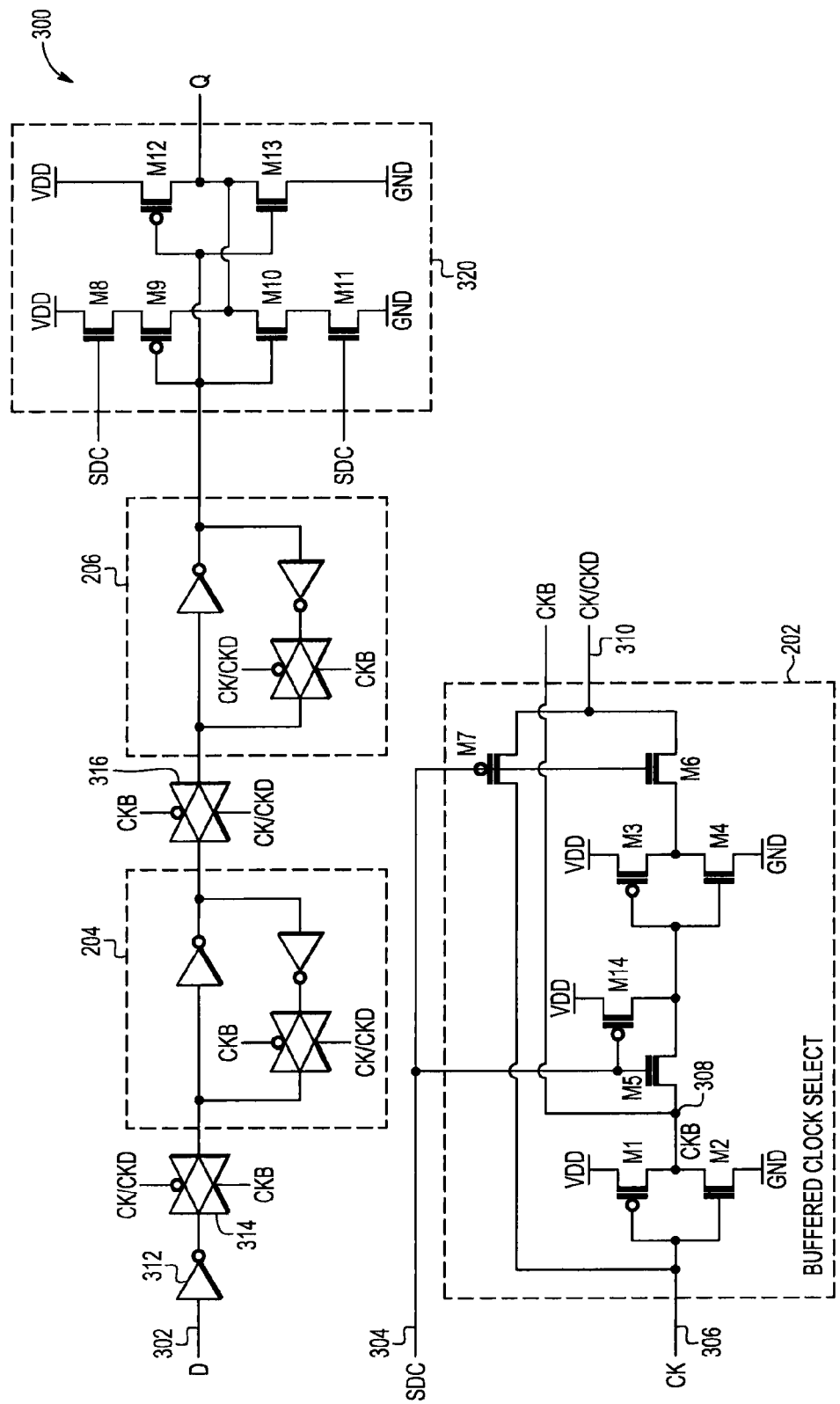
FIG. 6 is a schematic diagram showing an example implementation of the flip-flop of FIG. 5.

FIG. 6 is a schematic diagram showing an example implementation of the flip-flop device depicted in FIG. 5. Flip-flop 300 includes first and second latches, 204 and 206, respectively and buffered clock select 202. Flip-flop 300 includes an input terminal 302 configured to receive an input data signal D, an input terminal 304 configured to receive an SDC signal (such as the output signal generated by the PVT detector depicted in FIG. 3). Terminal 306 is configured to receive a system clock signal.

The system clock signal CK is received by buffered clock select 202 and inverted by an inverter comprising transistors M1 and M2 to generate an inverted clock signal CKB at node 308. When the input at SDC terminal 304 is low, transistors M7 and M14 become conductive and transistors M5 and M6 become non-conductive. As a result, buffered clock select 202 outputs the clock signal CK at node 310. However, when the SDC signal is high, transistors M7 and M14 become non-conductive and transistors M5 and M6 become conductive. This allows the inverted clock signal CKB to pass through transistor M5 where it is inverted by the inverter comprising transistors M3 and M4. The signal outputted by the inverted of transistors M3 and M4 passes through now-conductive transistor M6 and is outputted at node 310 as a delayed clock signal CKD. Accordingly, when the SDC signal is high, the clock signal CK is passed through two inverters to generate a delayed clock signal. Accordingly, the clock signal outputted by flip-flop 300 may either be a normal clock signal CK or a delayed clock signal CKD, depending upon the input value of the SDC signal. These two potential clock output signals are represented by CK/CKD, which indicates that the clock signals CK or CKD could be outputted at node 310. Throughout this disclosure, the term "CK/CKD" refers to a potential output of either a clock signal or a delayed clock signal, depending upon a particular input value.

The various signals CKB and CK/CKD generated by buffered clock select 202 are then used by latches 204 and 206 to process incoming data. In some implementations, one of more of the transistors M5, M6, and M7 may be replaced with transmission gates that are controlled using the SDC signal and an inverted SDC signal (not shown).

As data is fed into the flip-flop at terminal 302, the data signal passes through inverter 312 and a first transmission gate 314. Transmission gate 314 is controlled by the signals CKB and CK/CKD generated by buffered clock select 202. The data signal then cycles through the first and second latch 204 and 206 and intervening transmission gate 316 pursuant to the clock cycles CKB and CK/CKD.

The data signal is then passed from latch 206 to programmable output buffer 320. Output buffer 320 includes a first output stage and conductive path that includes transistors M12 and M13. Transistors M12 and M13 are always operational, the value of the SDC signal notwithstanding. A second output stage, including transistors M8, M9, M10, and M11 and forming a second conductive path within output buffer 320, is controlled by the SDC signal. When SDC signal is low, transistors M8 and M11 become non-conductive effectively removing the second stage from output buffer 320. This allows output buffer 320 to operate in a conventional manner. However, when the SDC signal goes high, transistors M8 and M11 become conductive. This allows the output stage comprising transistors M8, M9, M10, and M11 and the output stage comprising transistors M12 and M13 to operate in parallel, consuming additional energy, but effectively reducing the impedance of output buffer 320 and, thereby, reducing the delays of output buffer 320.

In some implementations, the system is configured to utilize more than one delay threshold in controlling the operation of a flip-flop. In such an implementation, a PVT detector is configured to output multiple SDC signals, where each SDC signal is associated with a particular range of delays that may be experienced within a particular device. For example, for estimated delays up to 30 picoseconds (ps), a PVT detector may not output an SDC signal, for delays greater than 30 ps, the PVT detector may output a first SDC signal (SDC1), and for estimated delays greater than 60 ps, the PVT detector may output both the first SDC signal and a second SDC signal (SDC2), the SDC signals can then be provided to a flip-flop that uses the signals to selectively improve the performance of the flip-flop, where the different SDC signals resulting in different performance increases (and corresponding increases in consumed energy) of the connected flip-flop.

Figure 7:
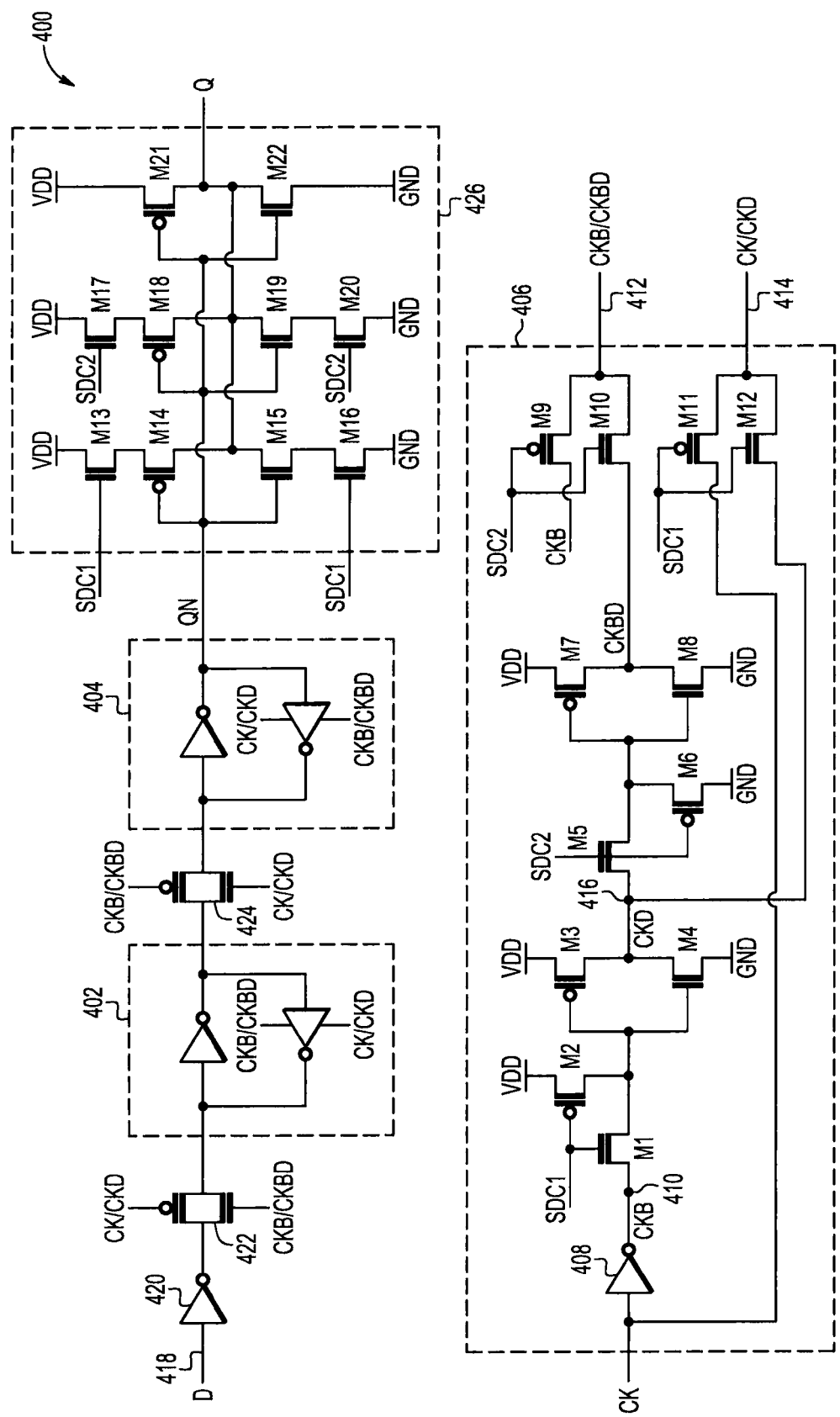
FIG. 7 is a schematic depicting a flip-flop design configured to receive a first and second SDC signal to control delay and set-up time occurring within the flip-flop.

FIG. 7 is a schematic depicting a flip-flop design configured to receive a first and second SDC signal to control delay occurring within the flip-flop. In this example, only two SDC signals, SDC1 and SDC2 are depicted, however it will be appreciated by a person of ordinary skill in the art that the circuit can be modified to incorporate any number of SDC signals by increasing the number of inverting stages in the buffered clock select circuit and the number of stages in the output buffer.

Referring to FIG. 7, flip-flop 400 includes master latch 402, slave latch 404, and buffered clock select 406. A system clock signal CK is received by buffered clock select 406 and inverted by inverter 408 to generate an inverted clock signal CKB at node 410. When both signals SDC1 and SDC2 are low, that inverted clock signal is then outputted at node 412 with transistor M9 being conductive. At the same time, the clock signal CK is outputted at node 414 with transistor M11 being conductive, while transistor M12 is non-conductive.

When the SDC signal SDC1 goes high (indicating that a first threshold delay has been reached within the PVT detector), transistor M1 becomes conductive and transistor M2 non-conductive. This causes the inverted clock signal CKB to be supplied to an inverter comprising transistors M3 and M4 to generate a delayed clock signal at node 416. That delayed clock signal CKD is then outputted at node 414 due to M12 being conductive and transistor M11 non-conductive.

When both SDC signals SDC1 and SDC2 are high (indicating that a second threshold delay has been reached within the PVT detector), transistor M5 becomes conductive and transistor M6 non-conductive. This allows the delayed clock signal CKD to be passed through an inverter comprising transistors M7 and M8 to generate a delayed inverted clock signal CKB. The delayed inverted clock signal CKB is then outputted at node 412 due to transistor M10 being conductive and transistor M9 being non-conductive.

The various signals CK, CKD, CKB, and CKBD generated by buffered clock select 406 are then used by latches 402 and 404 to process incoming data.

As data is fed into the flip-flop at terminal 418, the data signal passes through inverter 420 and a first transmission gate 422. Transmission gate 422 is controlled by the signals CK or CKD (indicated in FIG. 7 by the symbol CK/CKD) and CKB or CKBD (indicated in FIG. 7 by the symbol CKB/CKBD) generated by buffered clock select 403 at terminals 412 and 414 depending upon the values of SDC1 and SDC2. The data signal then cycles through the first and second latch 402 and 404 and intervening transmission gate 424 pursuant to the clock cycles CKB or CKBD and CK or CKD.

The data signal is then passed from latch 404 to programmable output buffer 426. Output buffer 426 includes a first output stage and conductive path including transistors M21 and M22. Transistors M21 and M22 are always operational, the value of the SDC signal notwithstanding.

A second output stage and conductive path, including transistors M13, M14, M15, and M16 is controlled by the SDC signal SDC1. When SDC1 is low, transistors M13 and M16 become non-conductive effectively removing the second stage from output buffer 426. This allows output buffer 426 to operate in a conventional manner. However, when SDC1 goes high, transistors M13 and M16 become conductive. This allows the output stage comprising transistors M13, M14, M15, and M16 and the output stage comprising transistors M21 and M22 to operate in parallel, consuming additional energy, but effectively reducing the impedance of output buffer 426 and, thereby, reducing the delays of output buffer 426.

A third output stage and conductive path, including transistors M17, M18, M19, and M20 is controlled by the SDC signal SDC2. When SDC2 is low, transistors M17 and M20 become non-conductive effectively removing the third stage from output buffer 426. However, when SDC2 goes high, transistors M17 and M20 become conductive. This allows the output stage comprising transistors M17, M18, M19, and M20 and the output stage comprising transistors M21 and M22 to operate in parallel, consuming additional energy, but effectively reducing the impedance of output buffer 426 and, thereby, reducing the delays of output buffer 426. Accordingly, when both SDC1 and SDC2 are high, all stages of the output buffer are conductive, greatly reducing the output impedance of the buffer and reducing delays therein.

The present disclosure provides embodiments of an SDC control signal that can be utilized to control the delays incurred within multiple flip-flops that belong to the same clock domain. The SDC control signal may be controlled by a PVT detector. In some cases, a multiplexer is also used to override, or otherwise control the operation of the PVT detector and, thereby, the SDC control signal. In one implementation, the PVT detector circuit can sense the change of propagation delay on CMOS logic cells and assert a signal indicating a change on delay level.

When the PVT detector indicates that the propagation delay of the logic has increased more than a threshold, the flip flops connected to the PVT detector will reduce their respective setup time and the ck to q propagation delay by adding an inverter to their internal clock signal generators and reducing the impedance of their output buffers. These internal adjustments are configured to compensate for the timing delays that result from the PVT conditions. When the delay detected does not exceed the threshold, the extra stages of the connected flip flops are disabled to both relax the setup and propagation delay time performance of the flip-flops and also reduce power consumption.

This disclosure is intended to explain how to fashion and use various embodiments in accordance with the disclosure rather than to limit the true, intended, and fair scope and spirit thereof. The foregoing description is not intended to be exhaustive. Modifications or variations are possible in light of the above teachings. The embodiment(s) was chosen and described to provide the best illustration of the principles of the disclosure and its practical application, and to enable one of ordinary skill in the art to utilize the disclosure in various embodiments and with various modifications as are suited to the particular use contemplated. All such modifications and variations are within the scope of the disclosure as determined by the appended claims, as may be amended during the pendency of this application for patent, and all equivalents thereof, when interpreted in accordance with the breadth to which they are fairly, legally, and equitably entitled.

What is claimed is:

1. An apparatus, comprising:
a flip-flop including:
    a first input configured to receive a first setup time and delay control (SDC) signal,
    a second input configured to receive a second SDC signal, and
    an output buffer including first, second, and third conductive paths, the second conductive path being non-conductive when the first SDC signal has a first value at the first input and being conductive when the first SDC signal has a second value at the first input and the third conductive path being conductive when the second SDC signal has a third value at the second input; and
a propagation delay sensor configured to:
    estimate a propagation delay of the flip-flop,
    compare the propagation delay to a first threshold and a second threshold, and
    when the estimated propagation delay exceeds the first threshold, supply the first SDC signal having the second value to the first input of the flip-flop and when the estimated propagation delay exceeds the second threshold, supply the second SDC signal having the third value to the second input of the flip-flop.

2. The apparatus of claim 1, wherein the propagation delay sensor is a process, voltage, temperature sensor.

3. The apparatus of claim 1, wherein the flip-flop includes a clock delay stage controlled by the first SDC signal and the second SDC signal.

4. The apparatus of claim 3, wherein, when the first SDC signal has the second value at the first input, the clock delay stage operates to delay a clock signal received by the flip-flop.

5. The apparatus of claim 4, wherein, when the first SDC signal has the first value at the first input, the clock delay stage is not operative.

6. The apparatus of claim 1, wherein the propagation delay sensor is configured to supply the first SDC signal having the first value to the first input of the flip-flop when the estimated propagation delay does not exceed the first threshold.

7. The apparatus of claim 1, wherein the first threshold is $(Tperiod/2+Thold)*n$, where Tperiod is a system clock period of the apparatus and Thold is the hold time of a flip-flop of the propagation delay sensor, and n is a value equal to or greater than 1.

8. The apparatus of claim 1, wherein the second threshold is $(Tperiod/2+Thold)+((Tperiod-Tsetup)-(Tperiod/2+Thold))/2$, where Tperiod is a system clock period of the apparatus, Thold is the hold time of the flip-flop of the propagation delay sensor, and Tsetup is a setup time of the flip-flop of the propagation delay sensor.

9. The apparatus of claim 1, including a second flip-flop having an input configured to receive the first SDC signal, the first flip-flop belonging to a first clock domain and the second flip-flop belonging to the first clock domain.

* * * * *